United States Patent
Kim et al.

(10) Patent No.: US 7,045,424 B2
(45) Date of Patent: May 16, 2006

(54) METHOD OF FABRICATING LOCAL SONOS TYPE GATE STRUCTURE AND METHOD OF FABRICATING NONVOLATILE MEMORY CELL HAVING THE SAME

(75) Inventors: Ki-Chul Kim, Gyeonggi-do (KR); Jin-Hee Kim, Gyeonggi-do (KR); Sung-Ho Kim, Gyeonggi-do (KR); Geum-Jong Bae, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/903,967

(22) Filed: Jul. 30, 2004

(65) Prior Publication Data

US 2005/0037577 A1   Feb. 17, 2005

(30) Foreign Application Priority Data

Aug. 14, 2003   (KR) .................. 10-2003-0056631

(51) Int. Cl.
*H01L 29/336* (2006.01)
*H01L 29/3205* (2006.01)
*H01L 29/4763* (2006.01)
*H01L 29/302* (2006.01)

(52) U.S. Cl. .................. 438/260; 438/287; 438/589; 438/739

(58) Field of Classification Search .............. 438/260, 438/594, 739, 445, 452, 437, 426, 362, 589, 438/287
See application file for complete search history.

(56) References Cited

U.S. PATENT DOCUMENTS 5,547,883 A * 8/1996 Kim ........................ 438/158
6,501,681 B1   12/2002 Van Buskirk et al.
6,696,328 B1 * 2/2004 Rhee et al. ............... 438/199

* cited by examiner

*Primary Examiner*—Chuong Anh Luu

(74) *Attorney, Agent, or Firm*—Marger Jonson & McCollom, P.C.

(57) ABSTRACT

There is provided a method of fabricating a local SONOS type gate structure and a method of fabricating a nonvolatile memory cell having the same. The method includes forming a gate dielectric layer on a semiconductor substrate. A gate pattern, including a gate electrode and a hard mask layer pattern which are sequentially stacked, is formed on the gate dielectric layer. Then, a recess is formed on the boundary of the gate pattern and the gate dielectric layer. The recess is formed on one side wall of the gate pattern, and is prevented from forming on the other side wall of the gate pattern. A tunnel layer and a trapping dielectric layer are sequentially formed on substantially the entire surface of the semiconductor substrate having the recess formed thereon to fill the recess. At least a portion of the trapping dielectric layer is formed inside the recess.

32 Claims, 7 Drawing Sheets

METHOD OF FABRICATING LOCAL SONOS TYPE GATE STRUCTURE AND METHOD OF FABRICATING NONVOLATILE MEMORY CELL HAVING THE SAME

CROSS-REFERENCE TO RELATED APPLICATION

This application claims the benefit of Korean Patent Application No. 2003-56631, filed on Aug. 14, 2003, the disclosure of which is hereby incorporated herein by reference in its entirety.

BACKGROUND OF THE INVENTION

1. Field of the Invention

This disclosure relates to a method of fabricating a nonvolatile memory device and more particularly, to a method of fabricating a local SONOS type gate structure and a method of fabricating a nonvolatile memory cell having the gate structure.

2. Description of the Related Art

A nonvolatile memory device is characterized by being able to retain data in a state where supplied electricity is cut-off unlike a volatile memory device. Thus, such a nonvolatile memory device, for example, a flash memory device, has been widely used in file systems, memory cards, portable equipment, or the like.

The nonvolatile memory devices are classified into a stacked gate structure and a SONOS (silicon-oxide-nitride-oxide-silicon) type gate structure depending on the type of its gate structure. The stacked gate structure is typically structured in such a manner that a tunnel oxide layer, a floating gate, an oxide-nitride-oxide (ONO) dielectric layer, and a control gate are sequentially stacked on the channel region of a semiconductor substrate.

Here, hot electron injection is induced to program the nonvolatile memory cell having a stacked gate structure. That is, a high voltage is applied to the control gate and a potential difference between a source region and a drain region is generated. As a result, hot electrons are generated in the channel region near the drain region, and the hot electrons exceed the energy barrier of the tunnel oxide layer so as to be injected into the floating gate. With the injection of the electrons into the floating gate, a threshold voltage is increased. Thus, if a voltage, lower than the increased threshold voltage, is applied to the control gate, an electric current does not flow through the programmed cell. By using these characteristics, the stored information can be read.

Further, the information of a nonvolatile memory cell having the stacked gate structure is erased by removing the electrons in the floating gate by the Fowler-Nordheim (F-N) tunneling mechanism. That is, a high voltage is applied to the source region, 0 V is applied to the control gate and the substrate, and the drain region is floated. As a result, a strong electric field would be generated between the source region and the floating gate so as to induce the F-N tunneling.

On the other hand, the SONOS gate structure is structured in such a manner that a tunnel oxide layer, a trapping dielectric layer, a blocking oxide layer, and a gate electrode are sequentially stacked on the channel region of a semiconductor substrate.

Thus, a nonvolatile memory cell having the SONOS gate structure is programmed typically by inducing hot electron injection, like the memory cell having the stacked gate structure as above. That is, a high voltage is applied to the gate electrode and a potential difference between a source region and a drain region is generated. As a result, hot electrons are generated in the channel region near the drain (or source) region, and the hot electrons exceed the energy barrier of the tunnel oxide layer so as to be injected into the trapping dielectric layer. With the injection of the electrons into the trapping dielectric layer, the threshold voltage is increased. Thus, if a voltage, lower than the increased threshold voltage, is applied to the gate electrode, an electric current does not flow through the programmed cell. By using these characteristics, the stored information can be read.

Here, the electrons inside the trapping dielectric layer can be removed normally by the F-N tunneling mechanism or hot hole injection, etc.

In fact, the SONOS gate structure has many advantages over the stacked gate structure as follows. Firstly, the SONOS gate structure is lower in height than the stacked gate structure. Therefore, the step height difference between the memory cell region and peripheral circuits can be reduced. Secondly, the stacked gate structure requires that the surface of the floating gate be large, but the SONOS gate structure does not require that the surface of the trapping dielectric layer be large. Therefore, the SONOS gate structure is more advantageous than the stacked gate structure to realize the highly-integrated nonvolatile memory devices. Thirdly, as the SONOS gate structure does not include a floating gate, its structure is similar to the gate structure of a typical MOS transistor. Therefore, the above structural characteristic allows for the advantageous use of CMOS technologies, which have been known and acknowledged. Fourthly, as the trapping dielectric layer of the SONOS gate structure is a nonconductive layer, injected electrons cannot move freely. Therefore, the SONOS gate structure has excellent retention characteristics in comparison to the stacked gate structure because it is affected little by pin holes, which may be formed in the tunnel oxide layer.

However, the SONOS gate structure may present some problems associated with an erase operation, i.e., incomplete erase or the like. The problem of incomplete erases, and the verifying method of erase, which may occur in the SONOS gate structure, are disclosed in the U.S. Pat. No. 6,501,681 in the title of "Using a low drain bias during erase verify to ensure complete removal of residual charge in the nitride in SONOS non-volatile memories" to Van Buskirt, et al.

In the meantime, as the trapping dielectric layer is a nonconductive layer, the electrons injected during a program operation do not move freely in the trapping dielectric layer. Therefore, in order to remove the injected electrons, hot holes should be injected through into the same region as the trapping dielectric layer region having the injected electrons distributed there through, or the F-N tunneling should be induced throughout the region. However, the hot hole or the F-N tunneling is induced around a source region or a drain region. Thus, if hot electron injection is induced throughout the broad region of the trapping dielectric layer during the program operation, it is difficult to remove such hot electrons.

Eventually, in order to use the SONOS gate structure, it is necessary to make the electrons injected during the program operation distributed only inside a narrow region of the trapping dielectric layer.

SUMMARY OF THE INVENTION

Exemplary embodiments of the present invention provide a method of fabricating a local SONOS type gate structure being capable of distributing electrons injected during a program operation into a narrow region of a trapping dielectric layer.

Another object of embodiments of the present invention is to provide a method of fabricating a local SONOS type gate structure being capable of forming a trapping dielectric layer interposed between a gate electrode and a semiconductor substrate to have a uniform width in the case of forming a plurality of cells.

A further object of embodiments of the present invention is to provide a method of fabricating a nonvolatile memory cell having the local SONOS type gate structure.

In accordance with an exemplary embodiment, the present invention provides a method of fabricating a local SONOS type gate structure. The method comprises forming a gate dielectric layer on a semiconductor substrate. A gate pattern is formed on the gate dielectric layer. The gate pattern may include a gate electrode and a hard mask layer pattern, which are sequentially stacked. Then, a recess is formed at an interface region between the gate pattern and the gate dielectric layer. The recess is formed on one side wall of the gate pattern, and is prevented from forming on the other side wall of the gate pattern. A tunnel layer and a trapping dielectric layer are sequentially formed on the semiconductor substrate having the recess formed thereon to fill the recess. A portion of the trapping dielectric layer is formed inside the recess.

Preferably, in an exemplary embodiment, the recess may be formed by forming an etch barrier pattern to expose one side wall of the gate pattern and to cover the other side wall of the gate pattern. Then, the semiconductor substrate having the etch barrier pattern formed thereon is etched using the etch barrier pattern and the hard mask layer pattern as etch masks. The lower portion of the exposed gate pattern contacting the gate dielectric layer is etched by the etching. Then, the etch barrier pattern is removed.

In another aspect of the present invention, the present invention provides a local SONOS type nonvolatile memory cell. The method may include the fabrication processes of the local SONOS type gate structure described as above.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
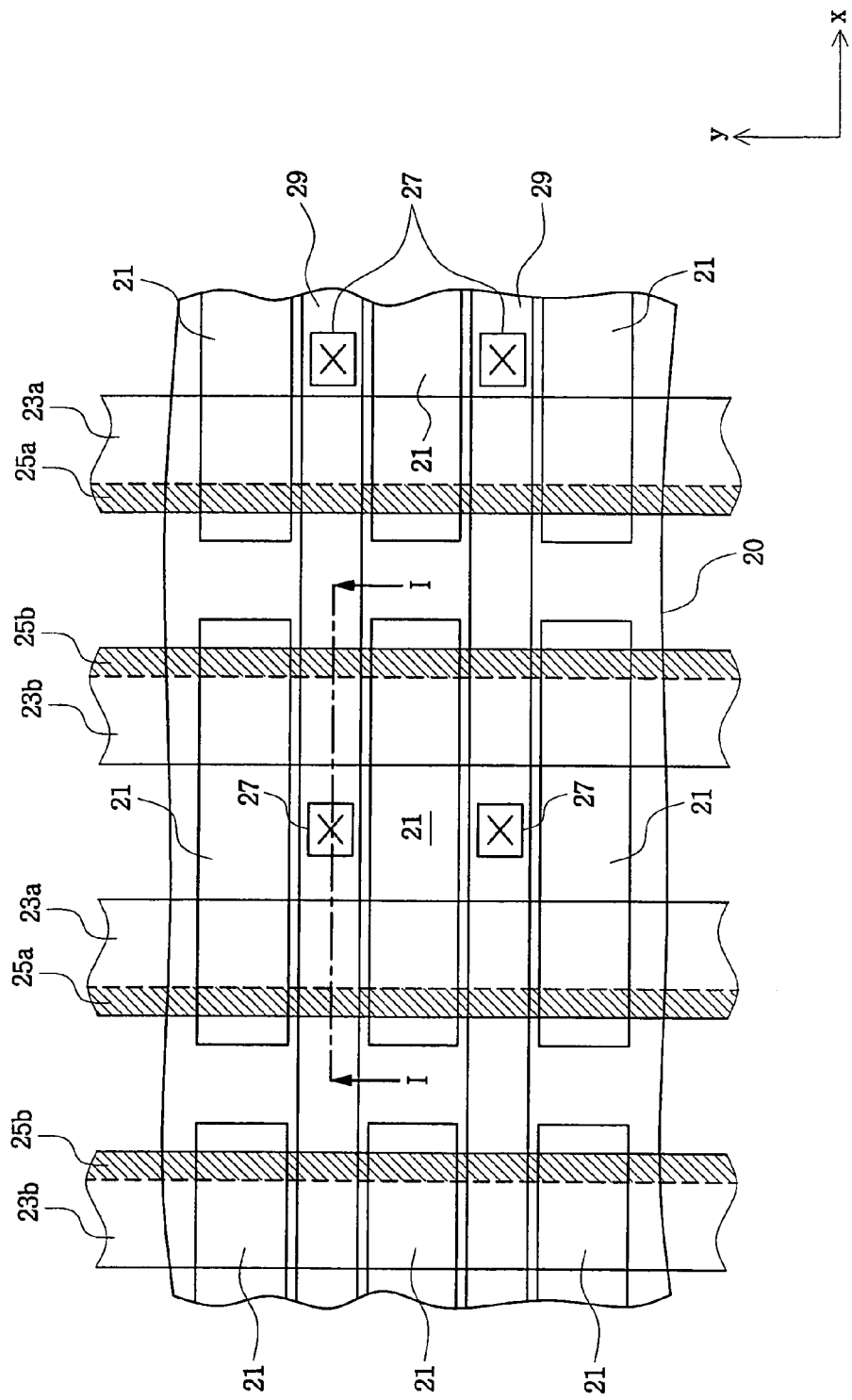
FIG. 1 is a layout of nonvolatile memory cells having local SONOS type gate structures according to a preferred embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a layout of nonvolatile memory cells having local SONOS type gate structures according to a preferred embodiment of the present invention.

Referring to FIG. 1, isolation regions 21 are aligned inside a cell region 20 in uniform intervals in the x-axis and the y-axis. The rest of the cell region 20 except the isolation regions 21 is an active region. The isolation regions 21 can be aligned continuously along the x-axis.

Gate electrodes 23a and 23b are aligned to cross over the isolation regions 21 in the y-axis. The active regions that are surrounded by the gate electrodes 23a, 23b and the isolation regions 21, are drain regions, and the rest of the active region is source regions. Charge trapping regions 25a and 25b partially overlapped by the gate electrodes 23a and 23b are located on the left side portion or the right side portion of the gate electrodes 23a and 23b adjacent to the source regions.

Contact holes 27 are located in the drain regions. The contact holes 27 and the bit lines 29 located to cross over the gate electrodes 23a and 23b are aligned in regular patterns. The bit lines are electrically connected to the drain regions through the contact holes 27. In the meantime, the source regions located between the gate electrodes 23a and 23b are electrically connected to a common electrode (not shown).

Now herein after, the description will be made of a method of fabricating nonvolatile memory cells according to a preferred embodiment of the present invention, and further, of a program operation of the memory cell and its read and erase operations.

Figure 2:
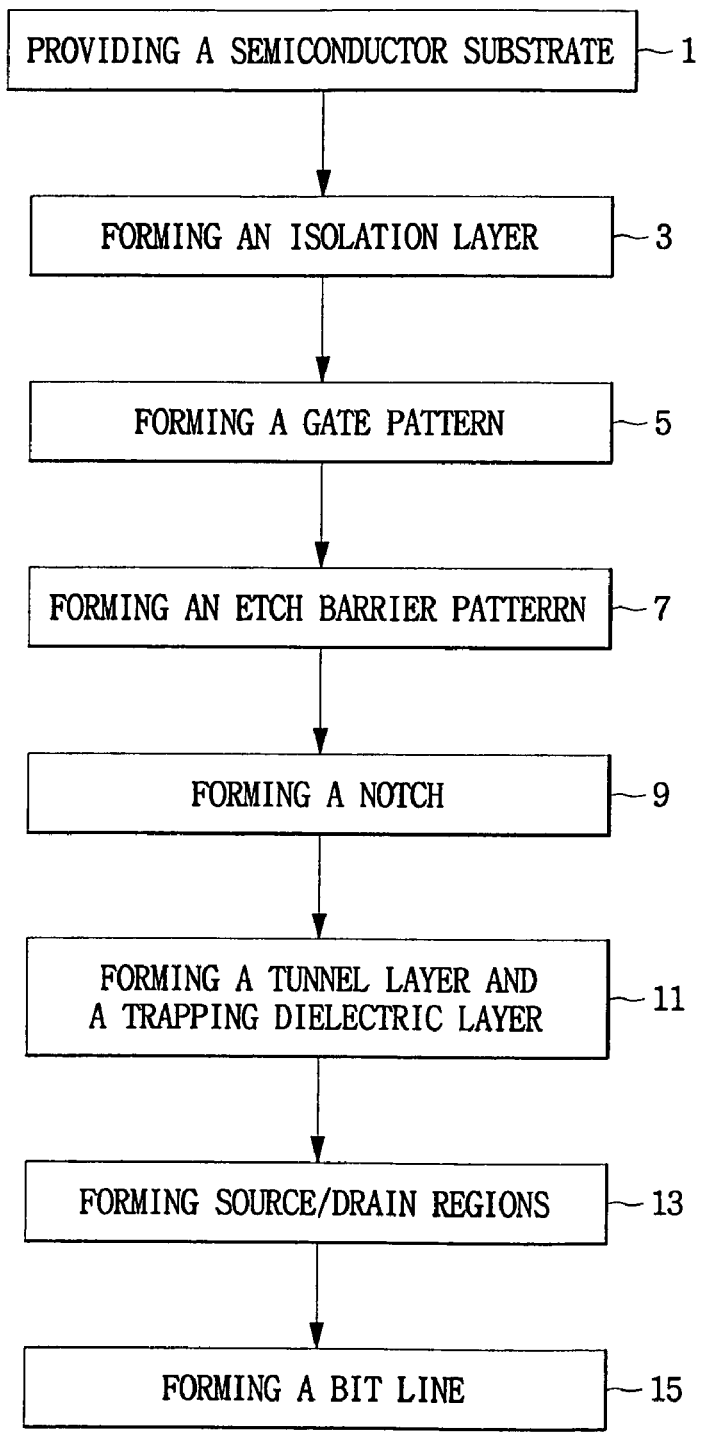
FIG. 2 is a flow chart to illustrate a method of fabricating a nonvolatile memory cell according to a preferred embodiment of the present invention.

FIG. 2 shows processing sequences to illustrate a method of fabricating a nonvolatile memory cell according to a preferred embodiment of the present invention, and FIGS. 3 to 7 are cross-sectional views to illustrate a method of fabricating a nonvolatile memory cell having a local SONOS type gate structure according to a preferred embodiment of the present invention taken along the cutting line I—I of FIG. 2.

Figure 3:
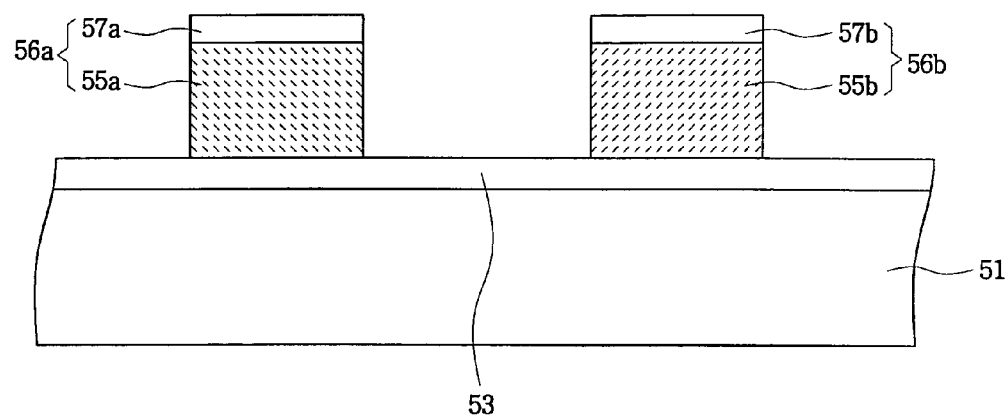
FIGS. 3 to 7 are cross-sectional views to illustrate a method of fabricating a nonvolatile memory cell according to a preferred embodiment of the present invention taken along the cutting line of I—I of FIG. 2.

Referring to FIGS. 2 and 3, a semiconductor substrate 51 is prepared (step 1 of FIG. 2). The semiconductor substrate 51 may be a silicon substrate doped with P-type impurities. An isolation layer is formed on the isolation regions 20 of FIG. 1 of the semiconductor substrate 51 (step 2 of FIG. 2). The isolation layer may be formed using a LOCOS technology or a chemical mechanical polishing technology.

A gate dielectric layer 53 is formed on the semiconductor substrate having the isolation layer formed thereon (step 3 of FIG. 2). The gate dielectric layer 53 may be formed of a silicon oxide layer (SiO2).

A gate conductive layer and a hard mask layer are sequentially formed on the semiconductor substrate having the gate dielectric layer 53 formed thereon. The gate conductive layer may be formed of at least one material layer selected from the group including a polycrystalline silicon (Poly-Si) layer, a tungsten (W) layer, a silicon germanium (SiGe) layer, a silicon germanium carbide (SiGeC) layer, a molybdenum (Mo) layer, a molybdenum silicide ($MoSi_2$) layer, a titanium (Ti) layer, a titanium silicide ($TiSi_2$) layer and a titanium nitride (TiN) layer, and preferably, it is formed of a polycrystalline silicon layer.

The hard mask layer and the gate conductive layer are sequentially patterned to form gate patterns 56a and 56b which comprise gate electrodes 55a, 55b and hard mask layer patterns 57a, 57b, which are sequentially stacked (step 3 of FIG. 2).

Figure 4:
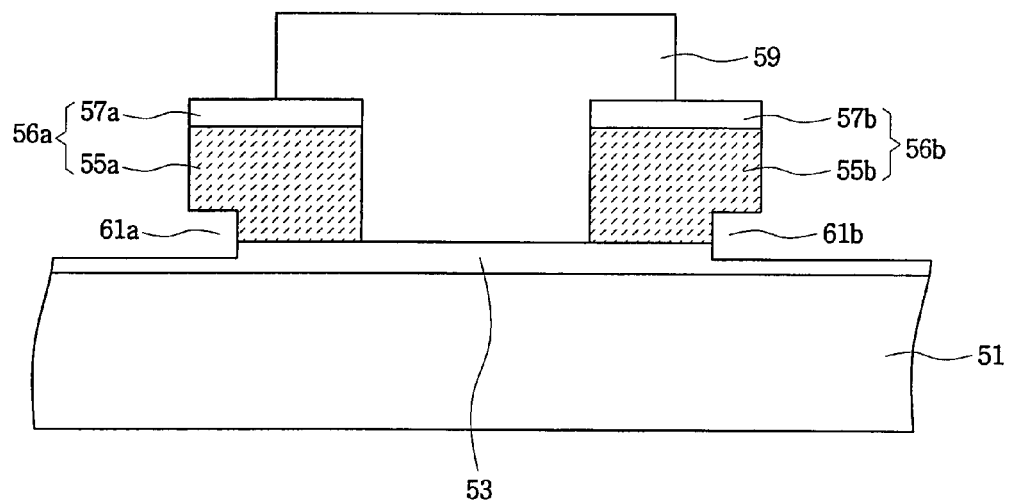

Referring to FIGS. 2 and 4, a photoresist layer is formed on the semiconductor substrate having the gate patterns 56a and 56b formed thereon. The photoresist layer is patterned through a photolithography and a development processes to form an etch barrier pattern 59 (step 5 of FIG. 2). As a result, as shown in FIG. 4, the etch barrier pattern 59 exposes one side wall of each of the gate patterns 56a, 56b, and covers the other side wall thereof. The exposed side walls of the gate patterns 56a, 56b face the opposite direction as each other.

Preferably, the etch barrier pattern 59 may be formed by employing a spin-on-glass (SOG) layer. That is, the SOG layer is formed on the semiconductor substrate having the gate patterns 56a, 56b formed thereon, and then, the SOG layer is patterned through a photolithography and an etch processes to form the etch barrier pattern 59.

The overall surface of the semiconductor substrate having the etch barrier pattern 59 formed thereon is etched. The overall etching can be performed using a dry etching technology. While the etching is performed on substantially the entire surface of the semiconductor substrate, a polymer can be formed on the exposed side walls of the gate patterns 56a, 56b. The polymer acts to prevent the exposed side walls from being etched. As a result, the lower surfaces of the gate patterns 56a, 56b contacting the gate dielectric layer 53 are etched to form recesses 61a, 61b (step 9 of FIG. 2).

While the etching process is performed uniformly on the semiconductor substrate, each of the recesses 61a, 61b has a uniform width and height on the semiconductor substrate.

During the process of forming the recesses 61a, 61b, the gate dielectric layer 53 may be etched. However, by using an etchant having an etching selectivity to the gate dielectric layer 53, the etching amount of the gate dielectric layer 53 may be minimized.

Figure 5:
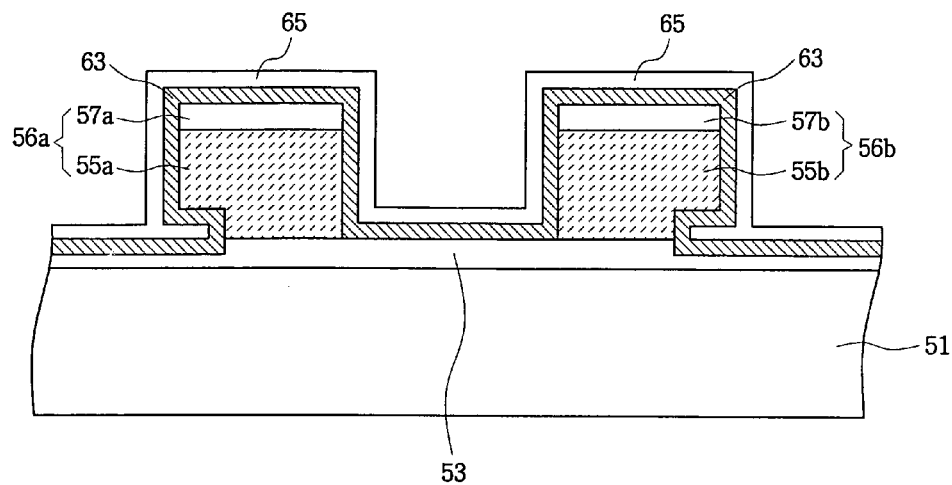

Referring to FIGS. 2 and 5, a tunnel layer 63 and a trapping dielectric layer 65 are sequentially formed on the semiconductor substrate having the recesses 61a, 61b formed thereon (step 11 of FIG. 2). The tunnel layer 63 may be formed of a silicon oxide layer or a high-k dielectric layer. In the meantime, the high-k dielectric layer may comprise an aluminum oxide ($Al_2O_3$) layer, a zirconium oxide ($ZrO_2$) layer, a hafnium oxide ($HfO_2$) layer, a lanthanum oxide ($La_2O_3$) layer or a tantalum oxide ($Ta_2O_5$) layer.

The tunnel layer 63 may be formed using a thermal oxidation or a chemical vapor deposition technology. The tunnel layer 63 is also formed on the inner walls of the recesses 61a, 61b. However, by controlling the thickness of the tunnel layer 63 formed on the inner walls of the recesses 61a, 61b, the openings of the recesses 61a, 61b should be prevented from being entirely blocked due to the tunnel layer 63.

The trapping dielectric layer 65 may be formed of a silicon nitride layer (SiN), a silicon oxy-nitride layer (SiON) or a boron nitride layer (BN), or formed of a high-k dielectric layer with high a amount of trap-sites. The high-k dielectric layer with high amounts of trap-sites may comprise an aluminum oxide ($Al_2O_3$) layer, a zirconium oxide ($ZrO_2$) layer, a hafnium oxide ($HfO_2$) layer, a lanthanum oxide ($La_2O_3$) layer or a tantalum oxide ($Ta_2O_5$) layer.

The trapping dielectric layer 65 is formed inside the recesses 61a, 61b. As a result, the trapping dielectric layer 65 inside the recesses 61a, 61b is surrounded by the tunnel layer 63. The tunnel layer 63 inside the recesses 61a, 61b, interposed between the trapping dielectric layer 65 and the gate patterns 56a, 56b, functions as a blocking layer to prevent the electrons trapped inside the trapping dielectric layer 65 from being injected into the gate electrodes 55a, 55b.

Figure 6:
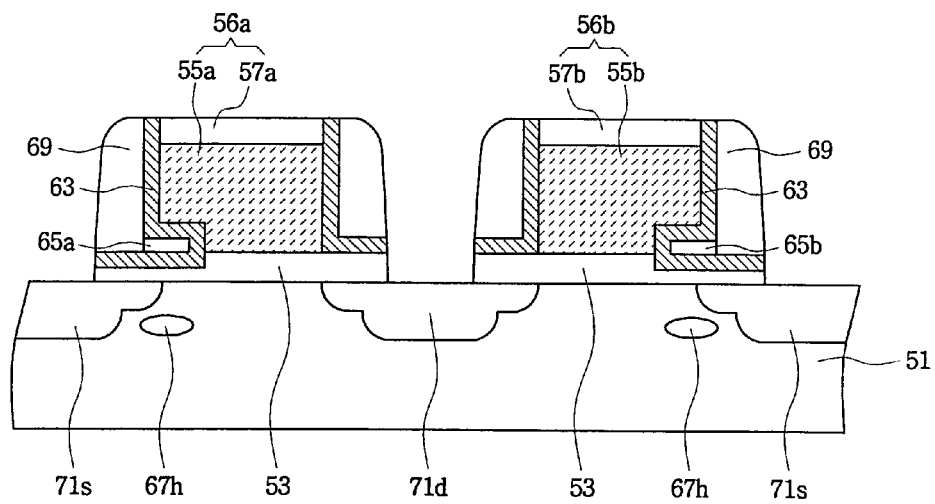

Referring to FIGS. 2 and 6, impurity ions are injected into the semiconductor substrate having the tunnel layer 63 and the trapping dielectric layer 65 formed thereon by using the gate patterns 56a, 56b as ion injection masks to form source regions 71s and drain regions 71d (step 13 of FIG. 2).

The source/drain regions 71d, 71s typically may be formed using extension ion implantation and high density impurity ion implantation processes.

Preferably, the trapping dielectric layer 65 is etched back and removed so as to expose the tunnel layer 63 on the upper surface of the gate patterns 56a, 56b. As a result, trapping dielectric layers 65a, 65b which remain inside the recesses 61a, 61b of FIG. 4 are formed, Here, the tunnel layer 63 may be removed. The trapping dielectric layer 65 may remain on the upper sidewall portions of the gate patterns 56a, 56b.

The trapping dielectric layers 65a, 65b remaining inside the recesses 61a, 61b are formed without patterning using a photolithography process. Therefore, the widths of the trapping dielectric layers 65a, 65b can be formed smaller, which is more advantageous for the high integration of devices.

N-type impurity ions are injected into substantially the entire surface of the semiconductor substrate having the trapping dielectric layers 65a, 65b formed thereon by using the gate patterns 56a, 56b as ion injection masks to form extension regions.

Before or after the extension regions are formed, P-type impurity ions are injected to form halos 67h. The regions where the halos 67h are formed may be confined to the portions underneath the trapping dielectric layers 65a, 65b as shown in FIG. 6.

A spacer layer is formed on the semiconductor substrate having the extension regions and the halos 67h formed thereon. The spacer layer may be formed of a silicon oxide layer or a silicon nitride layer. Then, the spacer layer is etched back to form spacers 69 to cover the side walls of the gate patterns 56a, 56b.

N-type high density impurity ions are injected using the spacers 69 and the gate patterns 56a, 56b as ion injection masks to form source/drain regions 71d, 71s.

Figure 7:
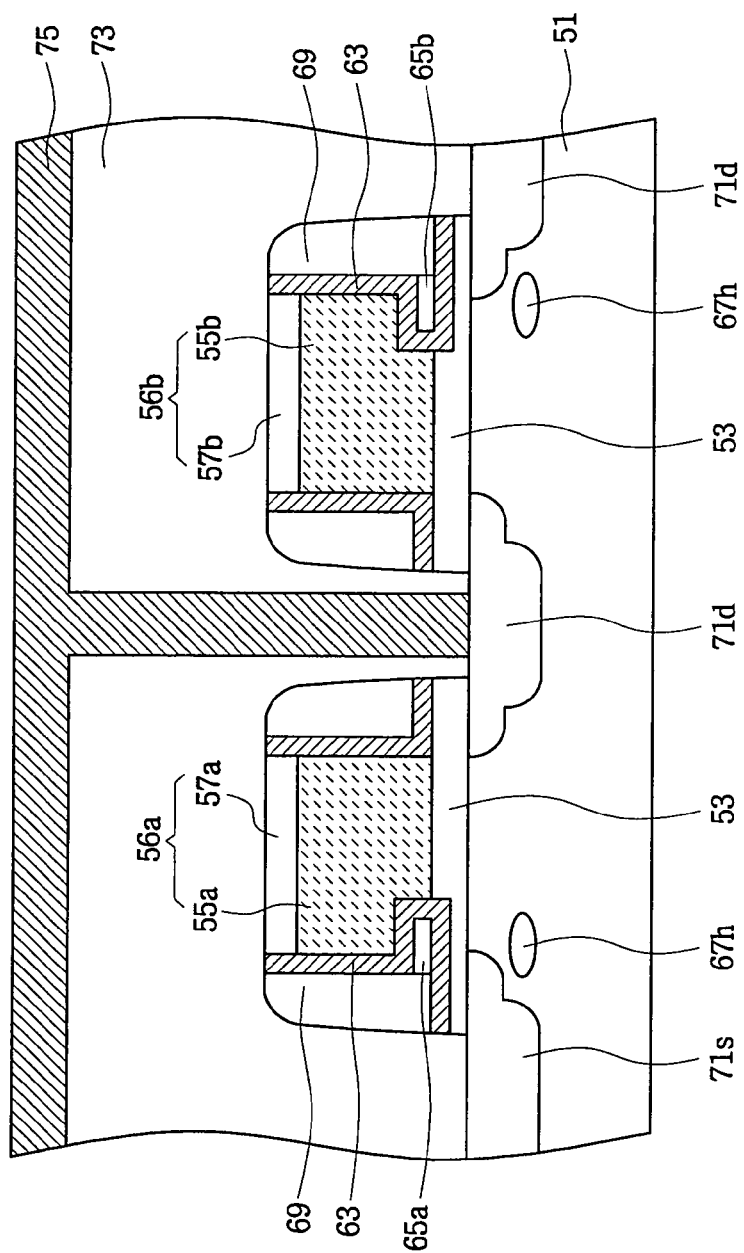

Referring to FIGS. 2 and 7, an interlayer insulating layer 73 is formed on the semiconductor substrate having the source/drain regions 71d, 71s formed thereon. Then, the interlayer insulating layer 73 is patterned to form a contact hole exposing the drain region 71d.

Then, a bit line 75 which is electrically connected to the drain region 71d through the contact hole is formed. The bit line 75 may be formed by forming a conductive layer filling the contact hole, and patterning through a photolithography and an etch processes. Alternatively, it may be formed by forming a trench line inside the interlayer insulating layer 73. A conductive layer is formed to fill the trench line, and then, the conductive layer is polished to the upper surface of the interlayer insulating layer 73 through a CMP process.

Nonvolatile memory cells are formed on the left and the right portions about the drain region 71d respectively.

Herein after, a description will be made on program, read and erase operations of a nonvolatile memory cell according to a preferred embodiment of the present invention in reference to FIG. 7. For convenience, the description will be confined to the cell located on the left of the drain region 71d.

The program operation is performed by applying a voltage to the gate electrode 55a and the source region 71s, and grounding the drain region 71d. As a result, hot electrons are generated near the source region 71s. The hot electrons are injected into the trapping dielectric layer 65a by crossing over the energy barrier of the tunnel oxide layer. With the hot electrons injected into the trapping dielectric layer 65a, the threshold voltage Vth of the nonvolatile memory cell is increased. As a result, information is stored in the nonvolatile memory cell.

In the meantime, some of the hot electrons generated near the source region 71s may be injected into the gate electrode 55a by crossing over the energy barrier of the gate dielectric layer 53. However, since the gate electrode 55a is a conductive layer, these hot electrons do not affect the threshold voltage of the nonvolatile memory cell. Therefore, the hot electrons, which may affect the threshold voltage, are only the ones which are injected into the trapping dielectric layer 65a.

A read operation is performed by applying a voltage to the gate electrode 55a and the drain region 71d, and grounding the source region 71s. The gate voltage Vg applied to the gate electrode 55a is lower than the threshold voltage when hot electrons are injected into the trapping dielectric layer 65a of the nonvolatile memory cell. Therefore, a channel current does not flow in the cell where hot electrons are injected into its trapping dielectric layer 65a. As a result, a "0" is read from the cell including the trapping dielectric layer 65a having hot electrons injected thereinto.

On the other hand, in the case that hot electrons are not injected into the trapping dielectric layer 65a, the applied gate voltage makes the channel turned on, so as to flow a channel current. Therefore, a "1" is read from the cell of which hot electrons are not injected into the trapping dielectric layer 65a.

Unlike the program operation, by applying a voltage to the drain region 71d, and grounding the source region 71s, a read operation is performed. Therefore, this is called a reverse read operation.

An erase operation can be performed by using hot hole injection. That is, a negative voltage is applied to the gate electrode 55a, and hot holes are generated near the source region. The hot holes are injected into the trapping dielectric layer 65a by crossing over the energy barrier of the tunnel layer 63 by the voltage of the gate electrode 55a. The hot holes, injected into the trapping dielectric layer 65a, remove the electrons inside the trapping dielectric layer 65a.

In the meantime, the trapping dielectric layer 65a is locally formed under the gate electrode 56a near the source region. Therefore, the hot electrons injected during the program operation are confined into the trapping dielectric layer 65a. Thus, the erase operation using the hot hole injection is only performed on the region of the locally formed trapping dielectric layer 65a.

The preferred embodiment of the present invention described as above is approximately 1 transistor per 1 cell (1T1C) which is advantageous for the high integration of devices. However, the present invention is not limited to 1T1C. For example, it may also be employed in a method of fabricating 2 transistors per 1 cell (2T1C) when a select transistor may be needed. This can be explained in reference to FIGS. 8 and 9.

Figure 8:
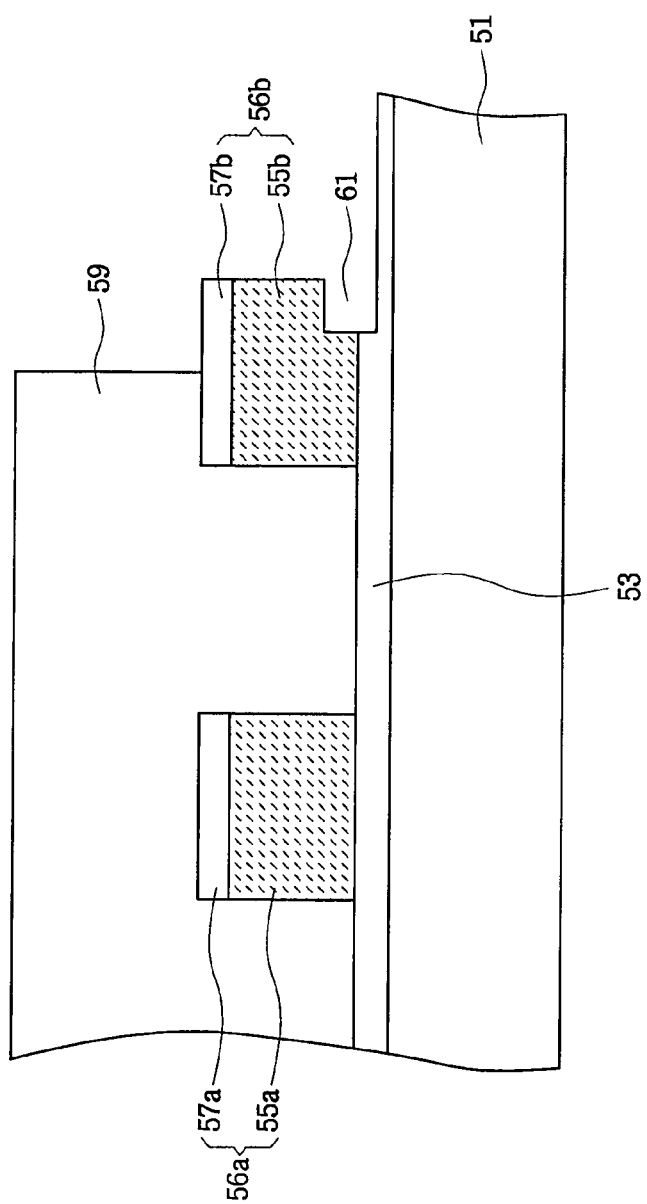
FIGS. 8 and 9 are cross-sectional views to illustrate a method of fabricating a nonvolatile memory cell according to another embodiment of the present invention.
Figure 9:
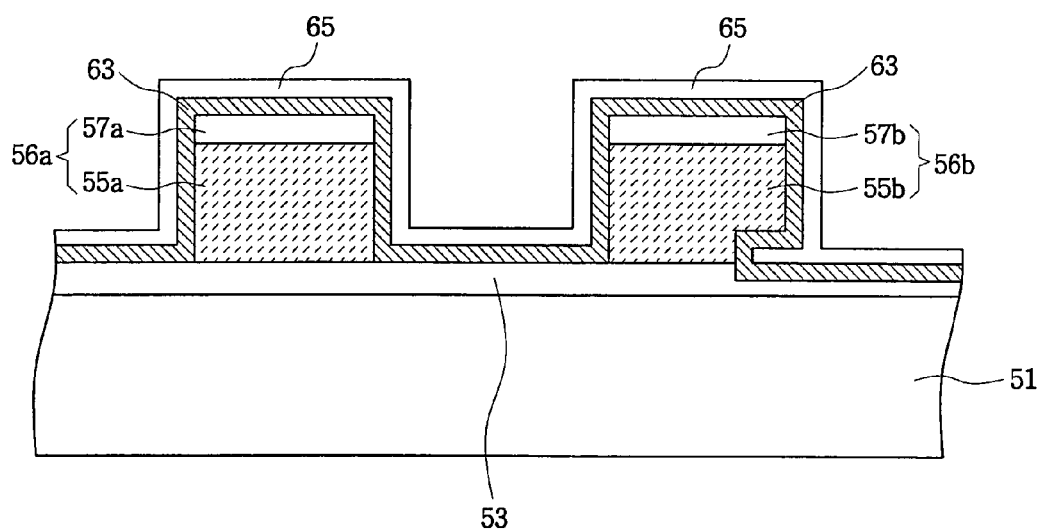

FIGS. 8 and 9 are cross-sectional views to illustrate a method of fabricating a nonvolatile memory cell according to another embodiment of the present invention.

Referring to FIG. 8, the same processes as those in the fabrication method as described in reference to FIG. 3 are performed. Thus, a gate dielectric layer 53 is formed on the semiconductor substrate 51, and gate patterns 56a, 56b are formed on the gate dielectric layer 53. One of the neighboring gate patterns is the gate pattern 56a of a select transistor, and the other one is the gate pattern 56b of a memory transistor.

An etch barrier pattern 59 is formed on the semiconductor substrate having the gate patterns 56a, 56b formed thereon. The etch barrier pattern 59 is formed to cover the both side walls of the gate pattern 56a of the select transistor, and to cover one side wall of the gate pattern 56b of the memory transistor. In the meantime, the etch barrier pattern 59 is formed to expose one side wall of the gate pattern 56b of the memory transistor.

The etch barrier pattern 59 may be formed of a photoresist layer or an SOG layer as described in reference to FIG. 4.

An etching process is performed using the etch barrier pattern 59 as an etch mask, as described in reference to FIG. 4. As a result, a recess 61 is formed in the lower portion of the one exposed side wall of the gate pattern 56b of the memory transistor.

Referring to FIG. 9, the etch barrier pattern 59 is removed, and a tunnel layer 63 and a trapping dielectric layer 65 are sequentially formed of the same material layers as described in reference to FIG. 5. As a result, the tunnel layer 63 is formed inside the recess 61 to cover the inner wall of the recess 61, and the trapping dielectric layer 65 is interposed between the tunnel layer 63 inside the recess 61.

Therefore, the structure of the component elements of the cell is formed as shown in the drawing, that is, the gate dielectric layer 53 is interposed between the gate pattern 56a of the select transistor and the semiconductor substrate 51, and the trapping dielectric layer 65 is partially interposed between the gate pattern 56b of the memory transistor and the semiconductor substrate 51.

Then, by performing the same processes as those described in reference to FIGS. 6 and 7, source/drain regions are formed, and a bit line being electrically connected to the drain region. Therefore, the fabrication of a 2T1C type of a nonvolatile memory cell of an embodiment of the present invention having a select transistor and a memory transistor located adjacent to each other is completed.

According to embodiments of the present invention, a local SONOS type gate structure can be fabricated, the gate structure being enhanced in its erase operation by distributing the electrons injected during a program operation only inside the narrow region of a trapping dielectric layer. Further, according to embodiments of the present invention, a recess is formed under a gate pattern through an etching process, and a trapping dielectric layer is formed inside the recess. Therefore, the above structural characteristics provides advantages for the high integration of devices in the case that a plurality of gate structures are formed on one semiconductor substrate since the width of the trapping dielectric layer, being interposed between the gate electrode and the semiconductor substrate, can be controlled in uniform, and the trapping dielectric layer can be partially formed without the performance of a photolithography process. Further, according to embodiments of the present invention, a nonvolatile memory cell having the local SONOS type gate structure can be fabricated.

While the invention has been particularly shown and described with reference to preferred embodiments thereof, it will be understood by those of ordinary skill in the art that various changes in form and details may be made therein without departing from the spirit and scope of the invention as defined by the attached claims.

What is claimed is:

1. A method of fabricating a local SONOS type gate structure, the method comprising:
   forming a gate dielectric layer on a semiconductor substrate;
   forming a gate pattern on the gate dielectric layer, the gate pattern comprising a gate electrode and a hard mask layer pattern, which are sequentially stacked;
   forming a recess at an interface region between the gate pattern and the gate dielectric layer, the recess being formed on one side wall of the gate pattern, and being prevented from forming on the other side wall of the gate pattern; and
   conformally forming a tunnel layer and a trapping dielectric layer sequentially on the semiconductor substrate having the recess, at least a portion of the trapping dielectric layer being formed inside the recess.

2. The fabrication method according to claim 1, wherein the gate electrode is formed of at least one material layer selected from the group including SiGe, Poly-Si, W, SiGeC, Mo, $MoSi_2$, Ti, TiN, and $TiSi_2$ layer.

3. The fabrication method according to claim 1, wherein forming a recess comprises:
   forming an etch barrier pattern to expose one side wall of the gate pattern and to cover the other side wall of the gate pattern;
   etching the semiconductor substrate having the etch barrier pattern using the etch barrier pattern and the hard mask layer pattern as etch masks, thereby etching a portion of the lower portion of the exposed gate pattern contacting the gate dielectric layer; and
   removing the etch barrier pattern.

4. The fabrication method according to claim 3, wherein the etch barrier pattern comprises a photoresist layer or an SOG layer.

5. The fabrication method according to claim 3, wherein the etching is performed using a dry etching technology.

6. The fabrication method according to claim 1, wherein the tunnel layer is formed using a thermal oxidation or a chemical vapor deposition technology.

7. The fabrication method according to claim 1, wherein the tunnel layer is a $SiO_2$ layer or a high-k dielectric layer.

8. The fabrication method according to claim 7, wherein the high-k dielectric layer comprises a material layer selected from the group consisting of $Al_2O_3$, $ZrO_2$, $HfO_2$, $La_2O_3$, $Ta_2O_5$ and combination thereof.

9. The fabrication method according to claim 1, wherein the trapping dielectric layer comprises a material layer selected from the group consisting of SiN, SiON, BN and combinations thereof.

10. The fabrication method according to claim 1, wherein the trapping dielectric layer is a high-k dielectric layer with a high amount of trap-sites.

11. The fabrication method according to claim 10, wherein the high-k dielectric layer with high amounts of trap-sites comprises a material layer selected from the group consisting of $Al_2O_3$, $ZrO_2$, $HfO_2$, $La_2O_3$, $Ta_2O_5$ and combinations thereof.

12. The fabrication method according to claim 1, further comprising forming spacers on side walls of the gate pattern.

13. A method of fabricating a local SONOS type nonvolatile memory cell comprising:
   forming a gate dielectric layer on a semiconductor substrate;
   forming a gate pattern on the gate dielectric layer, the gate pattern including a gate electrode and a hard mask layer pattern sequentially stacked;
   forming a recess at an interface region between the gate pattern and the gate dielectric layer, the recess being formed on one side wall of the gate pattern, and being prevented from forming on the other side wall of the gate pattern; and
   conformally forming a tunnel layer and a trapping dielectric layer sequentially on the semiconductor substrate having the recess to fill the recess, at least a portion of the trapping dielectric layer being formed inside the recess.

14. The fabrication method according to claim 13, wherein the gate electrode is formed of at least one material layer selected from the group consisting of SiGe, Poly-Si, W, SiGeC, Mo, $MoSi_2$, Ti, TiN, and $TiSi_2$ layer.

15. The fabrication method according to claim 13, wherein forming a recess comprises:
   forming an etch barrier pattern to expose one side wall of the gate pattern and to cover the other side wall of the gate pattern;
   etching substantially the entire surface of the semiconductor substrate having the etch barrier pattern using the etch barrier pattern and the hard mask layer pattern as etch masks, thereby etching a portion of the lower portion of the exposed gate pattern contacting the gate dielectric layer; and
   removing, the etch barrier pattern.

16. The fabrication method according to claim 15, wherein the etch barrier pattern comprises a photoresist layer or an SOG layer.

17. The fabrication method according to claim 15, wherein the etching is performed using a dry etching technology.

18. The fabrication method according to claim 13, wherein the tunnel layer is formed using a thermal oxidation or a chemical vapor deposition technology.

19. The fabrication method according to claim 13, wherein the tunnel layer is a SiO2 layer or a high-k dielectric layer.

20. The fabrication method according to claim 19, wherein the high-k dielectric layer comprises a material layer selected from the group consisting of $Al_2O_3$, $ZrO_2$, $HfO_2$, $La_2O_3$, $Ta_2O_5$ and combinations thereof.

21. The fabrication method according to claim 13, wherein the trapping dielectric layer comprises a material layer selected from the group consisting of SiN, SiON, BN and combinations thereof.

22. The fabrication method according to claim 13, wherein the trapping dielectric layer is a high-k dielectric layer with high amounts of trap-sites.

23. The fabrication method according to claim 22, wherein the high-k dielectric layer with high amounts of trap-sites comprises one material layer selected from the group consisting of $Al_2O_3$, $ZrO_2$, $HfO_2$, $La_2O_3$, $Ta_2O_5$ and combinations thereof.

24. The fabrication method according to claim 13, further comprising injecting impurity ions into the semiconductor substrate using the gate pattern as an ion injection mask to form source/drain regions.

25. The fabrication method according to claim 24, further comprising forming spacers to cover the side walls of the gate pattern prior to formation of the source/drain regions.

26. The fabrication method according to claim 24, further comprising the steps of:
   forming an interlayer insulating layer on the overall surface of the semiconductor substrate having the source/drain regions formed thereon; and forming a bit line electrically connected to the drain region.

27. A method of fabricating a local SONOS type gate structure, the method comprising:
   forming a gate dielectric layer on a semiconductor substrate;
   forming a first and a second gate pattern on the gate dielectric layer, each of the first and second gate patterns comprising a gate electrode and a hard mask layer pattern, which are sequentially stacked;
   forming a recess at an interface region between only the first gate pattern and the gate dielectric layer, the recess being formed on one side wall of the first gate pattern, and being prevented from forming on the other side wall of the first gate pattern; and
   conformally forming a tunnel layer and a trapping dielectric layer sequentially on the semiconductor substrate having the recess, at least a portion of the trapping dielectric layer being formed inside the recess.

28. The fabrication method according to claim 27, wherein the first gate pattern is a gate pattern of a memory transistor and the second gate pattern is a gate pattern of a select transistor.

29. The fabrication method according to claim 1, further comprising removing all but the portion of the trapping dielectric layer that is formed inside the recess.

30. The fabrication method according to claim 1, wherein forming the recess includes etching a portion of the gate pattern.

31. The fabrication method according to claim 1, wherein forming the recess includes etching both the gate pattern and the gate dielectric layer.

32. The fabrication method according to claim 13, wherein the conformally forming a tunnel layer and a trapping dielectric layer sequentially on the semiconductor substrate includes substantially completely filling the recess.

* * * * *